(12) United States Patent
Yuan et al.

(10) Patent No.: US 9,740,101 B2
(45) Date of Patent: Aug. 22, 2017

(54) ADDITIONS OF ORGANIC SPECIES TO FACILITATE CROSSLINKER REMOVAL DURING PSPI CURE

(71) Applicant: GLOBALFOUNDRIES INC., Grand Cayman (KY)

(72) Inventors: Qin Yuan, Poughquag, NY (US); Mark Chace, Beacon, NY (US); Jun Liu, Irvington, NY (US); Janine L. Protzman, Poughkeepsie, NY (US); Victoria L. Calero diaz del castillo, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 4 days.

(21) Appl. No.: 14/940,857

(22) Filed: Nov. 13, 2015

(65) Prior Publication Data

US 2017/0139324 A1 May 18, 2017

(51) Int. Cl.
*G03F 7/037* (2006.01)
*G03F 7/038* (2006.01)
(Continued)

(52) U.S. Cl.
CPC .............. *G03F 7/0387* (2013.01); *G03F 7/20* (2013.01); *H01L 21/02118* (2013.01);
(Continued)

(58) Field of Classification Search
CPC ..................................................... G03F 7/0387
See application file for complete search history.

(56) References Cited

U.S. PATENT DOCUMENTS

2008/0103275 A1 5/2008 Wu et al.
2015/0301453 A1* 10/2015 Komori .................... C09D 7/12
257/40

FOREIGN PATENT DOCUMENTS

WO WO-2014/097992 A1 * 6/2014

OTHER PUBLICATIONS

Diab, M.A., et al.,"Thermal stability and degradation of poly(N-(4-chlorophenyl)acrylamide) homopolymer and copolymer of N-(4-chlorophenyl) acrylamide with methyl methacrylate"; Journal of Saudi Chemical Society, vol. 18, Issue 5, Nov. 2014.

(Continued)

*Primary Examiner* — Cynthia Hamilton
(74) *Attorney, Agent, or Firm* — Scully, Scott, Murphy & Presser, P.C.

(57) ABSTRACT

A formulation comprising an esterified polyamide resin with a photosensitive linkage, a polymerizable crosslinker, and an organic species is provided. The organic species is selected such that (a) when exposed to UV radiation, it copolymerizes with the polymerizable crosslinker and the photosensitive linkage on the esterified polyamide resin forming the crosslinking network, (b) during thermal cure the copolymer thus formed drops from polyimide backbones, and (c) wherein the thermal degradation temperature of the copolymer thus formed is lower than the thermal degradation temperature of the homopolymer formed from the polymerizable crosslinker and the thermal degradation temperature of the copolymer formed from the polymerizable crosslinker and the photosensitive linkage on the esterified polyamide resin. The formulation is useful in forming a semiconductor passivation layer and facilitates more complete removal of crosslinker using less stringent conditions.

19 Claims, 2 Drawing Sheets

(51) Int. Cl.
*G03F 7/20* (2006.01)
*H01L 23/29* (2006.01)
*H01L 23/31* (2006.01)
*H01L 21/02* (2006.01)

(52) U.S. Cl.
CPC .. *H01L 21/02318* (2013.01); *H01L 21/02348* (2013.01); *H01L 23/293* (2013.01); *H01L 23/3171* (2013.01)

(56) References Cited

OTHER PUBLICATIONS

Figueroa, L.A.B., Thermal behavior ofpoly(2-hydroxyethylmethacrylate-bis-[trimethoxysilylpropyl]amine) networks, Third Congress on Materials Science and Engineering (CNCIM—Mexico 2012) 45, (2013) 012005.

\* cited by examiner

ADDITIONS OF ORGANIC SPECIES TO FACILITATE CROSSLINKER REMOVAL DURING PSPI CURE

BACKGROUND

The present application relates to a formulation and method useful, e.g., in forming a passivation layer as occurs in semiconductor manufacturing; more particularly, to a formulation and method that facilitates more complete removal of crosslinker, as commonly used in the formation of a passivation layer, under less aggressive processing conditions.

In Far Back End of Line (FBEOL) portion of a semiconductor device processing sequence, a passivation layer is often employed for protective purposes by providing a stress, water, and electrical barrier to the underlying wiring. Among other things, the passivation layer plays a role in preventing chip-package-interconnection (CPI) failure. Commonly, a photosensitive polyimide (PSPI) is used to form the passivation layer because of its thermal and chemical stability, and mechanical strength. The formation of the passivation layer normally entails a multistep process.

First, the PSPI is typically formed by spin-coating a combination of a base polymer—usually an esterified polyamide resin with photosensitive groups, e.g. methacrylate functional groups, linked to the carboxylic group—and a crosslinker, which is often a methacrylate, such as hydroxyethyl methacrylate (HEMA), to form a film on the pertinent surface of the semiconductor device at FBEOL. This, and other aspects typically entailed in this processing now discussed are illustrated in FIG. 1. Film formation is usually followed by exposure of the film thus formed to ultraviolet (UV) radiation. The UV exposure causes the crosslinker, e.g. HEMA, to polymerize with the photosensitive group linkage on the base polymer, e.g., the esterified polyamide resin, forming the crosslinking network. The crosslinking enables photo-imaging, and the result is a photosensitive polymer: those areas that are crosslinked become insoluble to developer, whereas those areas that are not crosslinked will be washed away by developer.

Then, after photo-imaging and developer wash, a thermal cure process is usually performed whereby the esterified polyamide converts to a polyimide structure breaking the ester bonds and losing linkage to the crosslinker polymer (hereinafter known as "Polymer 1"), e.g. poly(HEMA). Polymer 1 may include both the homopolymer of the crosslinker and the copolymer of the crosslinker and the photosensitive linkage on the esterified polyamide resin. This conversion, also known as imidization, is typically performed at temperatures of about 350° C. to about 385° C., usually for a period of about 4 hours for the former temperature, to about 1 hour for the latter.

Also during the thermal cure, Polymer 1, e.g. poly (HEMA), de-polymerizes, and the monomer that ensues volatilizes and is baked out of the passivation layer in an effort to remove it. However, not all of the crosslinker, including its monomer, can be easily removed from the cured PSPI. Such monomer that remains can further evaporate, polymerize and subsequently contaminate product wafers and the manufacturing hardware, such as process chambers, used to generate them. Moreover, while aggressive processing conditions, such as a high temperature PSPI cure, e.g. in the range of about 385° C., can more effectively remove residual crosslinker, an attending consequence is a strong degradation in device performance, especially in pFET devices.

In view of the above, there is a continuing need for providing more complete removal of crosslinker from PSPI passivation layers using less aggressive processing conditions, including a lower cure temperature.

SUMMARY

A chemical formulation comprising an esterified polyamide resin with a photosensitive linkage, a polymerizable crosslinker, and an organic species is provided. The organic species is selected such that (a) when exposed to UV radiation, it copolymerizes with the polymerizable crosslinker and the photosensitive linkage on the esterified polyamide resin forming the crosslinking network (this copolymer hereafter known as "Polymer 2"), (b) during thermal cure Polymer 2 thus formed drops from polyimide backbones, and (c) wherein the thermal degradation temperature of Polymer 2 is lower than the thermal degradation temperature of Polymer 1. Polymer 2 may include both the copolymer of the polymerizable crosslinker and the organic species, and the copolymer of the polymerizable crosslinker, the organic species, and the photosensitive linkage on the esterified polyamide resin.

In one aspect of the present application, a method of removing crosslinker present in a cured passivation layer is provided. In one embodiment, as depicted in FIG. 2, the method includes providing a formulation comprising an esterified polyamide resin with a photosensitive linkage, a polymerizable crosslinker, and an organic species, the organic species being selected such that, when it, as part of the formulation, is exposed to UV radiation, it forms Polymer 2 with the polymerizable crosslinker and the pendent photosensitive linkage generating a crosslinking network, during thermal cure Polymer 2 drops from polyimide backbones, wherein the thermal degradation temperature of Polymer 2 is lower than the thermal degradation temperature of Polymer 1. The method then involves forming a film comprising the formulation on a surface; exposing the film to UV radiation under conditions effective to form Polymer 2 in the crosslinking network of the esterified polyamide resin; followed by curing the product resulting from this UV exposure under curing conditions effective to convert the esterified polyamide resin to a cured polyimide passivation layer, and to substantially remove Polymer 2 from the passivation layer.

DETAILED DESCRIPTION

Figure 1:
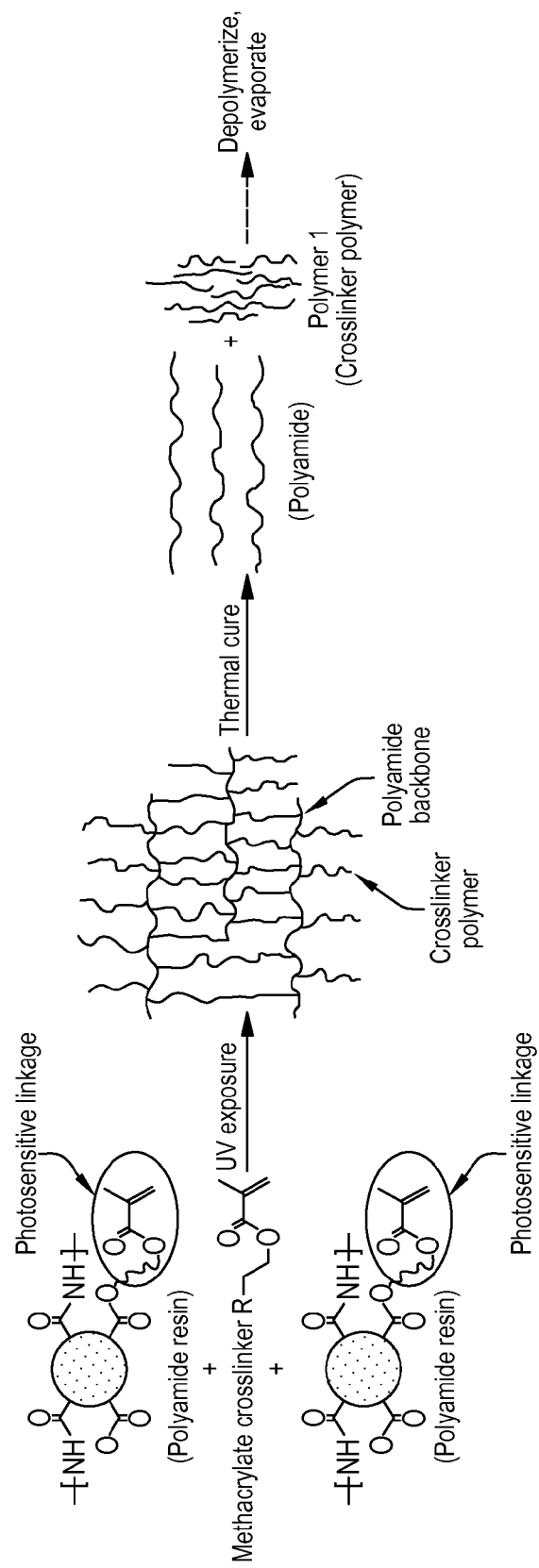
FIG. 1 graphically depicts chemical aspects in the formation of a typical passivation layer.
Figure 2:
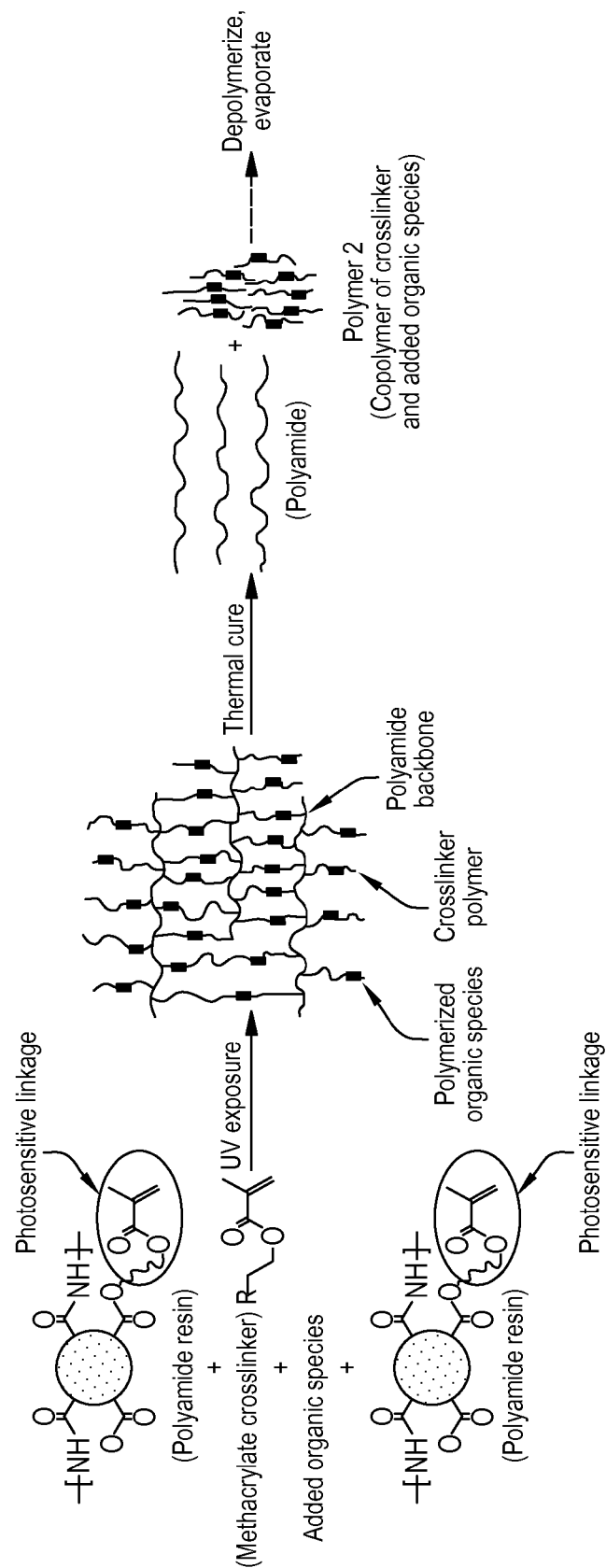
FIG. 2 graphically depicts chemical aspects in the formation of a passivation layer in an embodiment of the present application.

The present application will now be described in greater detail by the following discussion.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application. In the ensuing description, use of singular terms includes the plural, e.g. the functionalized polyamide resin can include combinations of such functionalized polyamide resins, the polymerizable crosslinker can include combinations of such polymerizable crosslinkers, and the organic species can include combinations of such organic species.

In one embodiment, the formulation comprises a functionalized polyamide resin, a polymerizable crosslinker, and an organic species as described hereunder. In a preferred embodiment the functionalized polyamide resin is an esterified polyamide resin, which is commercially available from HD MicroSystems under the trade name HD4004.

The polymerizable crosslinker comprises one or more compounds that can polymerize with itself to form homopolymers, and that can polymerize with the pendent photosensitive linkage of the aforementioned functionalized polyamide resin forming the crosslinking network. In one embodiment, the polymerizable crosslinker comprises one or more methacylates, including preferably esters of methacrylates, and more preferably substituted esters of methacrylates, such as hydroxyethyl methacrylate (HEMA).

The organic species comprises one or more compounds that are selected to meet the following criteria: (a) the organic species, when exposed to UV radiation, is capable of forming, and does form under UV radiation conditions effective to do so, Polymer 2 with the polymerizable crosslinker and the pendent photosensitive linkage on the functionalized polyamide resin generating the crosslinking network; in one practice in this regard, various strands or portions of strands of the functionalized polyamide resin are crosslinked whereas other strands or portions of strands are not crosslinked; (b) during thermal cure, Polymer 2 drops from polyimide backbones, and (c) the thermal degradation temperature of Polymer 2 is lower than the thermal degradation temperature of Polymer 1. Thermal degradation temperatures can be obtained by conventional techniques, such as derived from thermogravimetric analysis (TGA) and the like.

In one embodiment, the organic species is an acrylamide, preferably N-(4-chlorophenyl) acrylamide. The synthesis of N-(4-chlorophenyl) acrylamide is known in the art, as described in Diab, M. A. et al. "Thermal Stability and Degradation of Poly(N-(4-chlorophenyl)acrylamide homopolymer and copolymer of Poly(N-(4-chlorophenyl) acrylamide with Methyl Methacrylate" *Journal of Saudi Chemical Society*, vol. 18, issue 5, November 2014, pp. 638-645.

In one embodiment, the organic species is present in the formulation at less than 20% by weight, as based on the weight of the polymerizable crosslinker in the formulation; preferably, the organic species is present at less than 10% by weight based on the weight of the polymerizable crosslinker in the formulation. In another embodiment, the organic species is present in the formulation at about 1% by weight to about 15% by weight based on the weight of the polymerizable crosslinker in the formulation; preferably, the organic species is present at about 2% by weight to about 10% by weight based on the weight of the polymerizable crosslinker in the formulation.

The formulation preferably comprises an esterified polyamide resin, hydroxyethyl methacrylate (HEMA), and N-(4-chlorophenyl) acrylamide, wherein the N-(4-chlorophenyl) acrylamide is present at less than 10% by weight based on the weight of HEMA present in the formulation.

In one embodiment, the formulation is used as a passivation polymer formulation for semiconductor use.

The formulation can comprise part of a method of removing crosslinker present in a cured passivation layer as employed in semiconductor processing, e.g. FBEOL semiconductor processing. Typical FBEOL processes for fabricating smaller scaled semiconductor devices, e.g. 32 nm and 22 nm, use metallic pads that support a chip connection element and underlying metallurgy. Passivation layers are often used on at least one capping layer of such devices. In one embodiment, the method comprises:

(i) providing a formulation as herein described;
(ii) forming a film comprising the formulation on a surface, e.g. the surface of a semiconductor device, such as the capping layer, the film can be formed by conventional deposition techniques, e.g. spin coating;
(iii) exposing the film to UV radiation under conditions effective to form Polymer 2 crosslinking network of the esterified polyamide resin, conditions effective in this regard include conventional exposure amounts and times e.g. ghi-line (240 mJ/cm$^2$) and 25-60 seconds;
(iv) curing the product of step (iii) under conditions effective to convert at least a portion of the esterified polyamide resin to a cured polyimide passivation layer and to substantially remove Polymer 2 from the passivation layer. Substantial removal includes complete removal of Polymer 2 from the passivation layer, e.g. neither the polymerizable crosslinker nor the added organic species will be detected by outgassing, such as measured by Thermal Desorption Mass Spectroscopy (TDMS).

Curing can be accomplished thermally at temperatures that are less aggressive than conventionally used, e.g. thermal curing can occur at a temperature of less than 385° C., preferably at a temperature of about 350° C. or less. In one embodiment, the thermal cure occurs at a temperature between about 270° C. to about 325° C. The time for thermal cure can be less than 4 hours long, preferably the thermal cure is about 2 hours long.

While the present application has been particularly described with respect to various embodiments thereof, it will be understood by those skilled in the art that the foregoing and other changes in forms and details may be made without departing from the spirit and scope of the present application. It is therefore intended that the present application not be limited to the exact forms and details described herein, but fall within the scope of the appended claims.

What is claimed is:

1. A formulation comprising:
    an esterified polyamide resin with a photosensitive linkage;
    a polymerizable crosslinker selected from at least one methacrylate; and
    an organic species selected from an acrylamide, wherein when the organic
    species is exposed to UV radiation, the organic species forms a copolymer (Polymer 2) with the polymerizable crosslinker and the photosensitive linkage on the esterified polyamide resin generating a crosslinking network, wherein thermal degradation temperature of Polymer 2 is lower than thermal degradation temperature of a Polymer 1, wherein Polymer 1 comprises the homopolymer formed from the polymerizable crosslinker, and the copolymer formed from the polymerizable crosslinker and the photosensitive linkage on the esterified polyamide resin.

2. The formulation of claim 1 wherein the polymerizable crosslinker comprises hydroxyethyl methacrylate (HEMA).

3. The formulation of claim 1 wherein the organic species comprises N-(4-chlorophenyl) acrylamide.

4. The formulation of claim 1 wherein the organic species is present at less than 20% by weight based on the weight of the polymerizable crosslinker in the formulation.

5. The formulation of claim 4 wherein the organic species is present at less than 10% by weight based on the weight of the polymerizable crosslinker in the formulation.

6. The formulation of claim 4 wherein the organic species is present at about 1% by weight to about 15% by weight based on the weight of the polymerizable crosslinker in the formulation.

7. The formulation of claim 6 wherein the organic species is present at about 2% by weight to about 10% by weight based on the weight of the polymerizable crosslinker in the formulation.

8. A passivation polymer formulation for semiconductor use comprising:
   an esterified polyamide resin with a photosensitive linkage;
   hydroxyethyl methacrylate (HEMA); and
   N-(4-chlorophenyl) acrylamide, wherein the N-(4-chlorophenyl) acrylamide is present at less than 10% by weight based on the weight of the HEMA present in the formulation.

9. A method of removing crosslinker present in a cured passivation layer comprising:
   (i) providing a formulation comprising
   an esterified polyamide resin with a photosensitive linkage,
   a polymerizable crosslinker selected from at least one methacylate, and
   an organic species an organic species selected from an acrylamide, wherein, when the organic species is exposed to UV radiation, the organic species forms a copolymer (Polymer 2) with the polymerizable crosslinker and the photosensitive linkage on the esterified polyamide resin, wherein thermal degradation temperature of Polymer is lower than thermal degradation temperature of a Polymer 1, wherein Polymer 1 comprises the homopolymer formed from the polymerizable crosslinker and the copolymer formed from the polymerizable crosslinker and the photosensitive linkage on the esterified polyamide resin;
   (ii) forming a film comprising the formulation on a surface;
   (iii) exposing the film to UV radiation under conditions effective to generate a crosslinking network between Polymer 2 and the esterified polyamide resin;
   (iv) curing the product of step (iii) under conditions effective to convert at least a portion of the esterified polyamide resin to a cured polyimide passivation layer and to substantially remove Polymer 2 from the passivation layer.

10. The method of claim 9 wherein the polymerizable crosslinker comprises hydroxyethyl methacrylate (HEMA) and the organic species comprises N-(4-chlorophenyl) acrylamide.

11. The method of claim 10 wherein the N-(4-chlorophenyl) acrylamide is present at less than 10% by weight based on the weight of the HEMA present in the formulation.

12. The method of claim 9 wherein the curing is a thermal cure at a temperature of less than 385° C.

13. The method of claim 12 wherein the temperature is about 350° C. or less.

14. The method of claim 13 wherein the temperature is between about 270° C. to about 325° C.

15. The method of claim 13 wherein the thermal cure is less than 4 hours long.

16. The method of claim 15 wherein the thermal cure is about 2 hours long.

17. The method of claim 9 wherein the surface is on a semiconductor device.

18. The method of claim 9 wherein the method forms part of a Far Back End of Line (FBEOL) semiconductor device processing.

19. A semiconductor device comprising a passivation layer made from the formulation of claim 8.

* * * * *